(12) United States Patent
Cho et al.

(10) Patent No.: US 6,882,585 B2
(45) Date of Patent: Apr. 19, 2005

(54) ROM MEMORY DEVICE HAVING REPAIR FUNCTION FOR DEFECTIVE CELL AND METHOD FOR REPAIRING THE DEFECTIVE CELL

(75) Inventors: Kwang-Lae Cho, Gyeonggi-do (KR); Boo-Yung Huh, Gyeonggi-do (KR); Seong-Ho Jeung, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 119 days.

(21) Appl. No.: 10/601,560

(22) Filed: Jun. 24, 2003

(65) Prior Publication Data

US 2004/0037122 A1 Feb. 26, 2004

(30) Foreign Application Priority Data

Aug. 23, 2002 (KR) ................................ 10-2002-0050116

(51) Int. Cl.[7] ................................................. G11C 7/00
(52) U.S. Cl. ....................................... 365/200; 365/104
(58) Field of Search ............................ 365/200, 94, 104

(56) References Cited

U.S. PATENT DOCUMENTS

| 4,601,031 A | * | 7/1986 | Walker et al. | ............... 714/711 |
| 5,452,258 A | * | 9/1995 | Hotta | ..................... 365/230.03 |
| 5,502,676 A | * | 3/1996 | Pelley et al. | ................. 365/200 |

* cited by examiner

*Primary Examiner*—Son Mai
(74) *Attorney, Agent, or Firm*—Volentine, Francos & Whitt, PLLC

(57) ABSTRACT

Disclosed is a ROM device with a repair function where defective cells are repaired by a bit cell unit. The defective cells are repaired using a ground or operating (e.g., a supply) voltage line incorporated in the ROM device. This allows the defective cells to be repaired without separate redundant cells. After repairing, a test operation for replaced cells is not needed.

18 Claims, 6 Drawing Sheets

Data "0"

Data "1"

ROM MEMORY DEVICE HAVING REPAIR FUNCTION FOR DEFECTIVE CELL AND METHOD FOR REPAIRING THE DEFECTIVE CELL

CROSS REFERENCES TO RELATED APPLICATIONS

This application claims priority under 35 U.S.C. §119 from Korean Patent Application No. 2002-50116, filed on Aug. 23, 2002, the contents of which are hereby incorporated by reference in their entirety for all purposes as if fully set forth herein.

BACKGROUND AND SUMMARY

Technical Field

The present invention relates to Read Only Memory (ROM) devices, and more particularly to a ROM device having a repair function for defective cells, and a method for repairing defective cells.

Semiconductor memories are roughly classified into volatile memories and non-volatile memories based on whether stored data is retained even at power-off. The volatile memories include Dynamic Random Access Memory (DRAM) and Static Random Access Memory (SRAM) devices, and the non-volatile memories include ROMs, flash memories, and so on. These memories are used to store data processed in a system. As a storage unit, a memory cell must store data processed in a system stably. Accordingly, a test process for respective memory cells is inevitably required.

Conventional volatile memories incorporate a redundancy circuit, which replaces defective cells with redundant memory cells. When an external address for addressing defective cells is received, such a redundancy circuit allows a word line connected with the defective cells to be disabled and then corresponding redundant memory cells to be accessed. That is, a defective word line of a main memory cell array is replaced with a corresponding redundant word line of a redundant cell array.

In case of ROMs, data is stored in memory cells, according to a user's requirement, during the manufacturing process. That is, stored data in the memory cells is fixed (or does not vary) after the manufacturing process is completed. The ROMs need a further data coding step as compared with DRAMs or SRAMs. That is, a repair method of a conventional ROM includes replacing a word line connected to defective cells with a corresponding redundant word line, and performing a data coding operation for the replaced redundant word line so that data to be stored in defective cells is stored in redundant cells of the replaced redundant word line.

Accordingly, the conventional repair method needs a redundant memory cell array. Also, since a data coding step for the redundant memory cell array is necessitated after repairing, the process is complex and the cost increases. Furthermore, since defective cells are repaired by a row or column unit, repair efficiency is dropped and many redundant memory cells are required. This becomes an obstacle to realize a high density of ROMs. Also, a test for repaired redundant cells must be carried out, just like a main memory cell array.

SUMMARY

Accordingly, it would be advantageous to provide a ROM device with a repair function which is conducive to a high density device.

It would be advantageous to provide a repair method which is suitable for a ROM device.

In accordance with one aspect of the present invention, a ROM device with a repair function, and a repair method, use a ground line or an operating (e.g., a supply) voltage line that exists in the ROM device. Also, another aspect is that a ROM device with a repair function, and a repair method, repair defective cells by a bit cell unit. Here, the ground line is a grounded wire existing in the ROM device, and the voltage level corresponds to logical "0" data. The operating voltage line is a wire to which an operating voltage, such as VCC, is applied, and the voltage level corresponds to logical "1" data. Accordingly, separate redundant memory cells are not necessitated, and testing for replaced cells is not necessitated.

In particular, a ROM device includes a ROM cell array which has a plurality of memory cells; a cell selecting section which selects at least one of the plurality of memory cells in response to an input address; a sense amplifier section which senses data stored in the selected memory cell; a repair control section which generates a first select signal in response to the input address; and a first multiplexing section which selects and outputs either an output of the sense amplifier section or a fixed voltage, in response to the first select signal.

The repair control section generates the first select signal having either one of complementary states according to whether the input address corresponds to a defective cell. At this time, the first multiplexing section selects the wire when the first select signal is at a first logic state and the output of the sense amplifier section when the first select signal is at a second logic state. The first logic state is a logic high state, and the second logic state is a logic low state. Also, the opposite can be possible. For example, the repair control section generates the first select signal of a logic high state when the input address corresponds to a defective cell and the first select signal of a logic low state when the input address corresponds to a normal cell. The first multiplexing section selects the fixed voltage when the first select signal is at a logic high state, and selects the output of the sense amplifier section when the first select signal is at a logic low state.

The fixed voltage is one selected from ground and operating voltage lines in the device, with the lines having a ground voltage and an operating voltage respectively. For example, when a defective cell has a data "0" defect the fixed voltage is a ground voltage from a ground line, and when the defective cell has a data "1" defect, the fixed voltage is an operating voltage that is not ground.

This ROM device is suitable for any defect type that is specified to a fabrication process. That is, if a data "0" defect arises, a ground line is used as one input of the first multiplexing section. If a data "1" defect arises, an operating voltage line is used as one input of the first multiplexing section.

The cell selecting section includes a row decoder section which decodes a row address of the input address to select a row; a row driving section which drives the selected row; and a column decoder section which decodes a column address of the input address to select a column.

In this preferred embodiment, the repair control section includes a plurality of fuse boxes which correspond to a bit number of the input address and two fuses, respectively; a decoding block which has a plurality of NAND gates and receives outputs of the plurality of fuse boxes; and a NOR gate which is connected to outputs of the NAND gates.

When the input address appoints a defective cell, either one of the two fuses in the respective fuse boxes corresponding to an input address bit is cut so as to output a signal of a first state. When the input address appoints a normal cell, the two fuses in the respective fuse boxes are not cut so as to output a signal of a second state. For example, when the input address appoints a defective cell, a first fuse of the fuse box is fused when a corresponding address bit is "0", and a second fuse of the fuse box is fused when a corresponding address bit is "1".

A ROM device having a repair function comprises a cell array section which has a plurality of memory cells each storing a fixed data value; a cell selecting section which selects at least one of the memory cells in response to an input address; a sense amplifier section which senses data stored in the selected memory cell; a repair control section which generates a first select signal and a second select signals in response to the input address; and first and second multiplexing sections which operate responsive to the first and second select signals respectively. At this time, the first multiplexing section selects and outputs either one of outputs of the sense amplifier section and the second multiplexing section in response to the first select signal. The second multiplexing section selects either one of a ground line of a ground voltage and an operating voltage line of an operating voltage in response to the second select signal.

The repair control section generates the first select signal having a first logic state when the input address corresponds to a defective cell and a second logic state when the input address corresponds to a normal cell. Also, the repair control section generates the first select signal having either one of complementary states according to a defect type of the defective cell when the first select signal is at the first logic state. For example, the repair control section generates the second select signal of a first state when the input address is related to a data "1" defect and the second select signal of a second state when the input address is related to a data "0" defect.

Accordingly, when the input address corresponds to a defective cell, the first select signal has the first logic state and the first multiplexing section selects the output of the second multiplexing section. When the defective cell has a data "1" defect, the second select signal has the first logic state and the second multiplexing section selects the operating voltage line. That is, the data "1" defect is repaired. When the defective cell has a data "0" defect, the second select signal has the second logic state and the second multiplexing section selects the ground line. That is, the data "0" defect is repaired.

In this preferred embodiment, the repair control section includes a plurality of fuse boxes which correspond to a bit number of the input address; a decoding block which has a plurality of NAND gates and receives outputs of the plurality of fuse boxes; a NOR gate which is connected to outputs of the NAND gates to output the first select signal; a first NMOS transistor which has a gate connected to receive an output of the NOR gate and a source grounded; a select fuse which has one end connected to a drain of the NMOS transistor; and a resistor which has one end connected to the other end of the select fuse and the other end connected to receive an operating voltage, the second select signal being outputted from an interconnection of the select fuse and resistor.

Meanwhile, each of the fuse boxes is formed of a first CMOS transmission gate which receives an address bit; a first address fuse which is connected to the first CMOS transmission gate; a second CMOS transmission gate which an inverted version of the address bit; a second address fuse which is connected to the second CMOS transmission gate; and a second NMOS transistor which is connected between an interconnection node of the first and second address fuses and a ground voltage.

A repair method comprises the steps of generating a select signal according to whether a memory cell appointed by an input address is a defective cell or a normal cell; and selecting and outputting either a fixed voltage or a data value of the appointed memory cell in response to the select signal, the fixed voltage being an operating voltage that exists in a ROM device.

When the appointed cell is a normal cell, the select signal is inactivated and the appointed cell is selected. However, when the appointed cell is a defective cell, the select signal is activated and the fixed voltage is selected. That is, the defective cell of the input address is replaced.

In one case, voltage when the defective cell is a data "0" defect, the fixed voltage is a ground voltage from a ground line. On the other hand, when the defective is a data "1" defect, the fixed voltage is an operating voltage from an operating voltage line.

Meanwhile, if data "0" and "1" defects all arise, another select signal having logically complementary states is further generated. This allows either one of the ground and operating voltage lines to be selected according to a defect type of the defective cell.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION

The preferred embodiment of the invention will be more fully described with reference to the attached drawings.

Figure 1A:
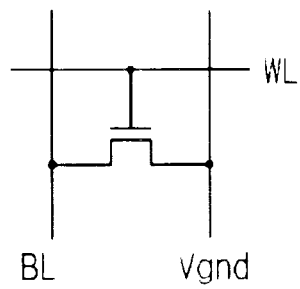
FIGS. 1A and 1B are equivalent circuit diagrams of ROM cells each storing data "0" and data "1;"
Figure 1B:
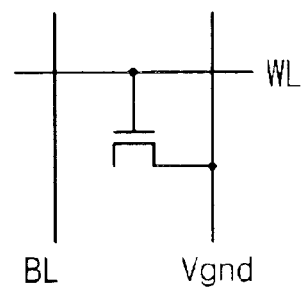
Figure 2:
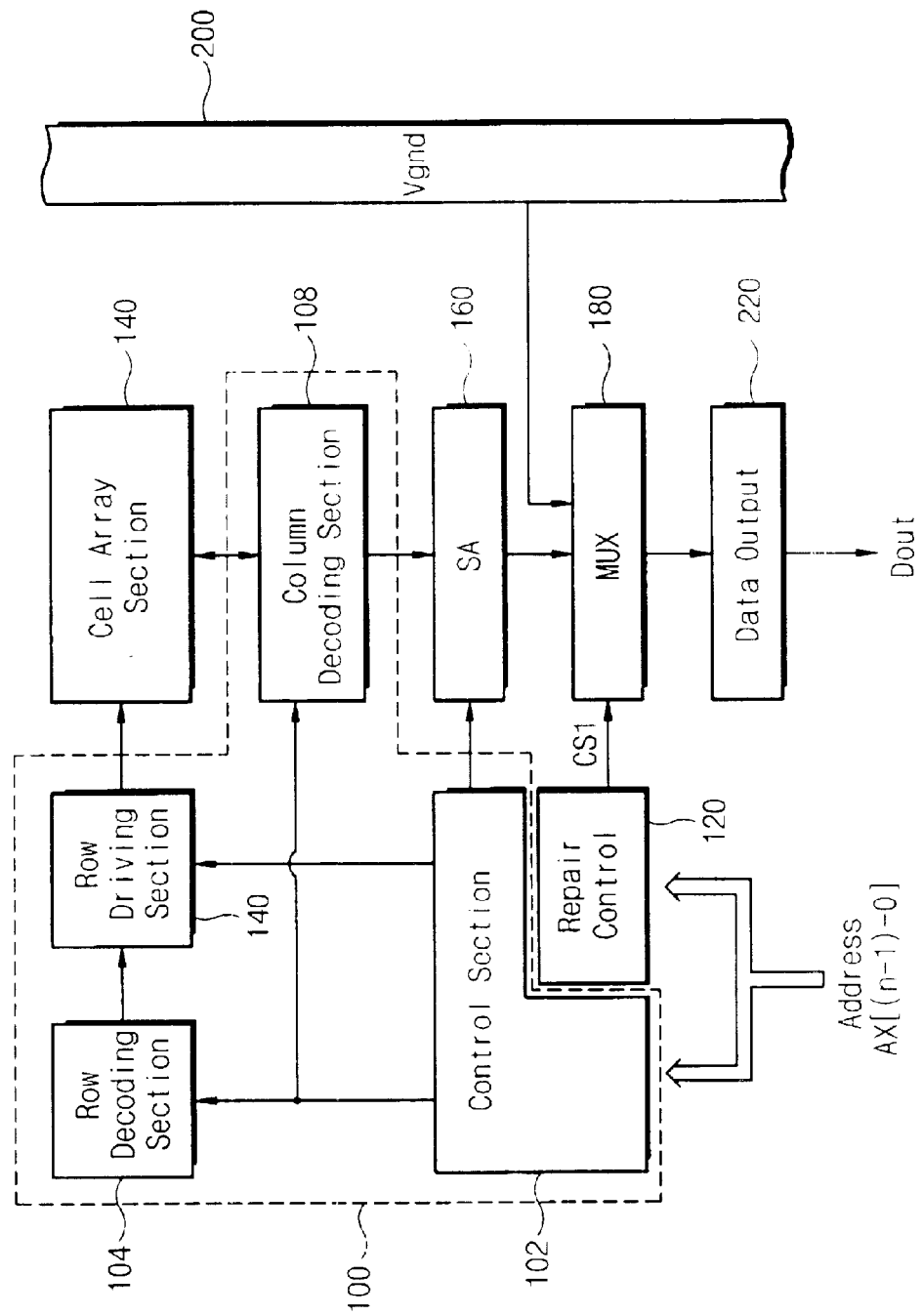
FIG. 2 is a schematic diagram of a ROM device according to a first preferred embodiment of the present invention.

FIG. 1A indicates an equivalent circuit of a ROM cell that stores data "0," and FIG. 1B indicates an equivalent circuit of a ROM cell that stores data "1." FIG. 2 is a block diagram of a ROM device according to a first preferred embodiment. A ROM device in FIG. 2 can repair defective cells having data "0" without redundant cells.

Referring to FIG. 2, the ROM device having a repair function includes cell selecting 100, a repair control section 120, a cell array section 140, a sense amplifier section 160 (abbreviated "SA" in the figure) a multiplexing section 180

(abbreviated "MUX" in the figure) and a data output section 220. The cell selecting section 100 includes a control section 102 for receiving an address, a row decoding section 104 for decoding a row address of an address received under the control of the control section 102, and a column decoding section 108 for selecting a specified memory cell of the received address by decoding a column address of the received address and selecting a specified column. The cell array section 140 is formed of a plurality of memory cells that store data values determined according to user's requirements, respectively.

The cell selecting section 100 selects at least one cell of the cell array section 140 in response to a received address. The data output section 220 is connected to an output of the multiplexing section 180, and the sense amplifier section 160 senses and amplifies data from one or more cells selected by the cell selecting section 100. An output of the sense amplifier section 160 is provided to one input of the multiplexing section 180, and the other input of the multiplexing section 180 is connected to the ground line 200.

The repair control section 120 activates or inactivates a select signal CS1 transferred to the multiplexing section 180 according to a received address. The multiplexing section 180 selects one of the received signals in response to the select signal CS1.

The ground line 200 is a grounded wire that, in general, exists in the ROM device. That is, the ground line 200 is a wire connected to a ground voltage, or is any wire grounded when the ROM device operates. The ground line 200 is simply connected to the other input of the multiplexing section 180.

The aforementioned ROM device has no need for a separate redundant cell array for repairing defective cells. Also, testing of repaired cells is not required.

Namely, in case of a normal state (when a received address corresponds to a normal cell), the repair control section 120, for example, generates the select signal CS1 of a logic low state. This allows the multiplexing section 180 to transfer an output of the cell array section 140 to the data output section 220.

However, if a cell corresponding to a received address is a defective cell (data "0" defect), the repair control section 120 generates the select signal CS1 of a logic high state. This allows the multiplexing section 180 to select the ground line 200. The ground voltage level of the ground line 200 is transferred to the data output section 220 via the multiplexing section 180. As a result, the data "0" defect can be repaired without a redundant cell array.

Figure 3A:
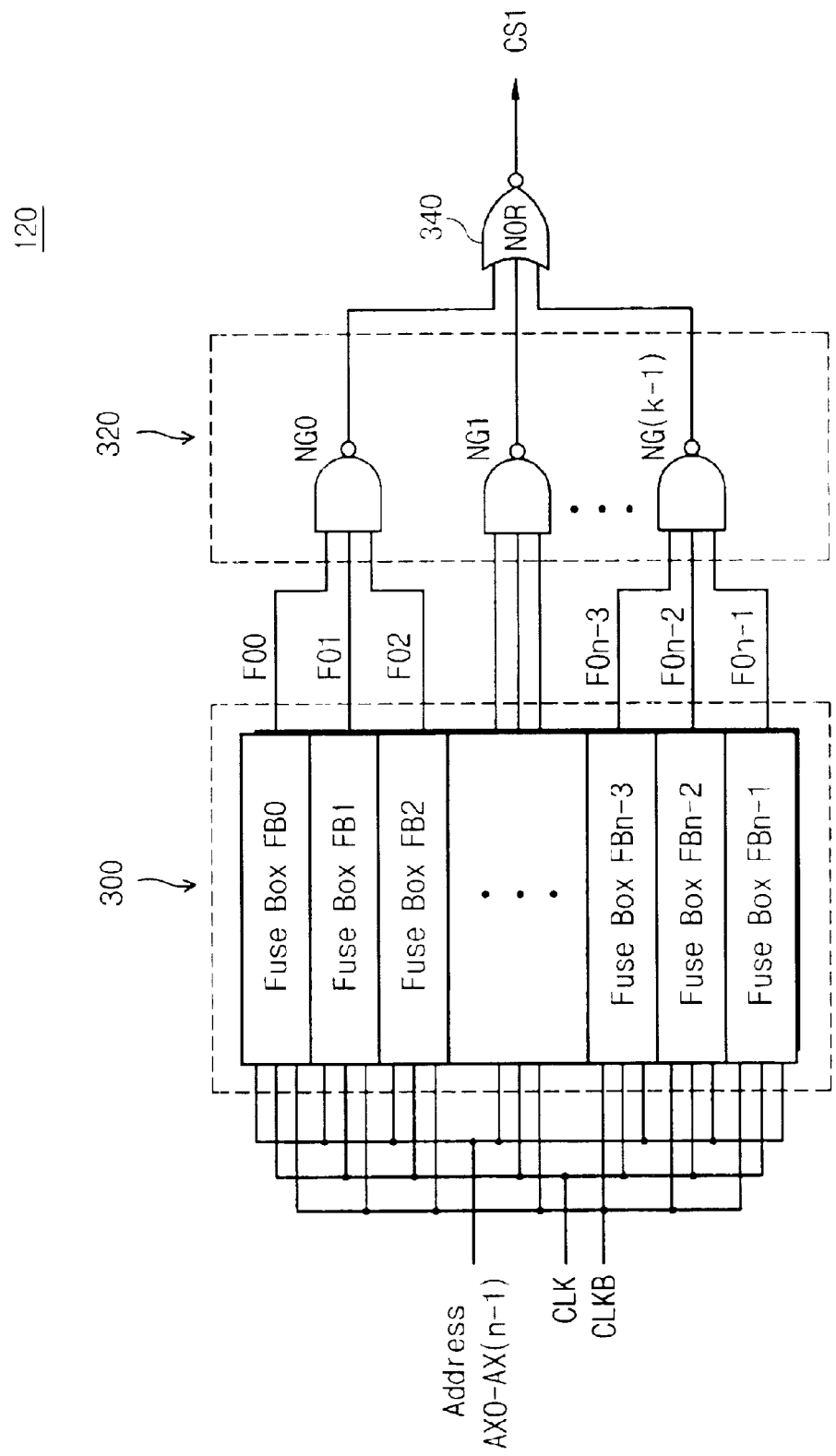
FIG. 3A is a preferred embodiment of a repair control section illustrated in FIG. 2.
Figure 3B:
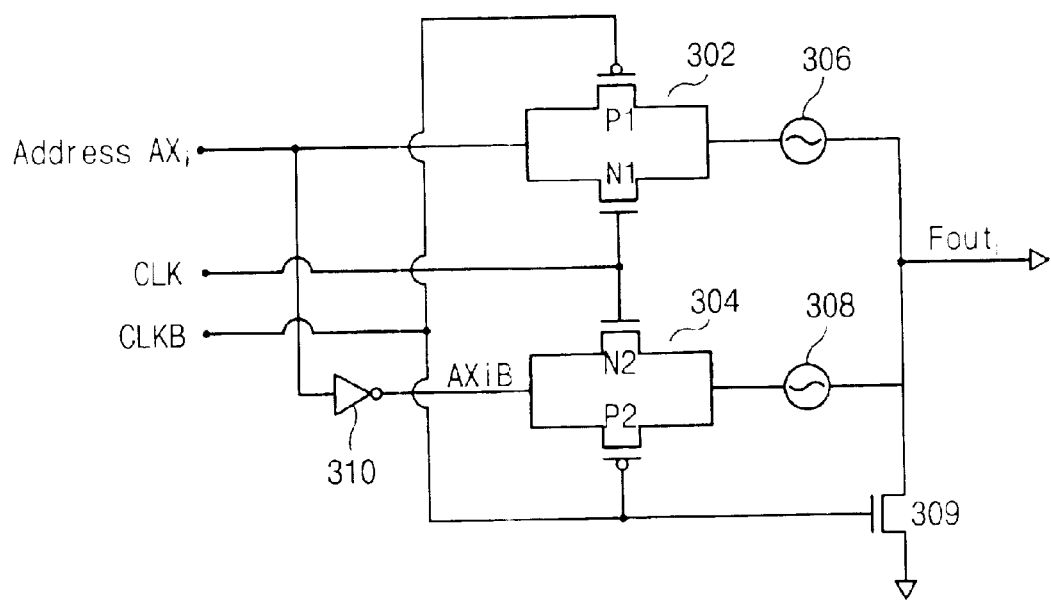
FIG. 3B is a preferred embodiment of a fuse box illustrated in FIG. 3A.

FIG. 3A is a preferred embodiment of a repair control section 120 illustrated in FIG. 2, and FIG. 3B is a preferred embodiment of a fuse box illustrated in FIG. 3A.

Referring to FIG. 3A, a repair control section 120 is formed of a fuse box block 300, a decoding block 320, and a NOR gate 340. The fuse box block 300 is formed of a plurality of fuse boxes FB0–FB(n-1) that correspond to input address bits AX0-AX(n-1), respectively. Each of the fuse boxes FB0-FB(n-1) receives an input address bit AXi (i=0 to n-1), a clock signal CLK, and an inverted version of the clock signal CLKB (hereinafter, referred to as an inverted clock signal). The decoding block 320 receives and decodes output signals FO0–FO(n-1) of the fuse box block 300, and is formed of a plurality of NAND gates NG0–NG(k-1) (k is an integer less than n). The NOR gate 340 receives output signals of the NAND gates NG0–NG(k-1) and outputs a select signal CS1, which is applied to a multiplexing section 180 in FIG. 2. Each of the fuse boxes FB0–FB(n-1) has two fuses that are selectively cut according to an input address bit.

In the case that an input address corresponds to a defective cell, one fuse in each of the respective fuse boxes FB0–FB(n-1) is cut such that all output signals FO0–FO(n-1) of the fuse boxes FB0–FB(n-1) have a logic high state. At this time, all output signals of the NAND gates NG0–NG(kZ-1) go low. This makes an output of the NOR gate 340 go high. Namely, the select signal CS1 of a logic high state is applied to the multiplexing section 180.

In particular, referring to FIG. 3B, each of the fuse boxes FB0–FB(n-1) is formed of two CMOS transmission gates 302 and 304, two fuses 306 and 308, an inverter 310, and an NMOS transistor 309. Each of the transmission gates 302 and 304 is formed of a PMOS transistor and an NMOS transistor. For example, the transmission gate 302 is formed of a PMOS transistor P1 and an NMOS transistor N1, and the transmission gate 304 is formed of a PMOS transistor P2 and an NMOS transistor N2.

An input address bit AXi is applied to the transmission gate 302 directly and to the transmission gate 304 via the inverter 310. Namely, the transmission gates 302 and 304 receive signals of complementary phases (or logic states), respectively. The clock signal CLK is applied to gates of the NMOS transistors N1 and N2, and the inverted clock signal CLKB is applied to gates of the PMOS transistors P1 and P2. The NMOS transistor 309 is connected between an output terminal Fouti and a ground voltage, and is controlled by the inverted clock signal CLKB. The number of fuse boxes, such as that shown in FIG. 3B, that are required is the same as the number of input address bits.

It is assumed that an input address AXi designates a defective cell. Under this assumption, if an input address bit is "0" the fuse 306 in each fuse box is cut or fused. If the input address bit is "1" the fuse 308 in each fuse box is cut or fused. Meanwhile, since the NMOS transistor 309 receives the inverted clock signal CLKB of a logic low state, it is turned off. Accordingly, an output signal Fouti of the fuse box goes high.

Now, an operation of a repair control circuit will be fully described below with reference to FIGS. 3A and 3B. To begin with, in a case where an input address AX[(n-1):0] designates a normal cell, fuses 306 and 308 in respective fuse boxes FB0–FBn-1 are not cut or fused. Since an inverted clock signal CLKB is at a logic low state, the NMOS transistor 309 becomes turned off. Meanwhile, since the transmission gates 302 and 304 all are turned on, input signals AXi and AXiB of complementary states are transferred to the output terminal Fouti via corresponding transmission gates and fuses. Namely, an address bit "0" is transferred to the output terminal Fouti via the transmission gate 302 and the fuse 306, and an address bit "1" is transferred to the output terminal Fouti via the transmission gate 304 and the fuse 308. When an input address AXi is "0", an inverted address bit AXiB of "1" is grounded by a driver (not shown) through which the address AXi is inputted to a fuse box. When an input address AXi is "1", it is grounded by the inverter 310 (namely, an NMOS transistor of the inverter 310). So the output Fouti is logic low level signal.

Alternatively, in a case where a master fuse is used, there can be used a method of making an output of the master fuse go low when not repaired.

This can be accomplished by delaying an output of the NOR gate 340 coupled with an output Fouti of a fuse box so that an address bit "1" is grounded.

In summary, as low-level signals FO0–FO(n-1) are outputted from fuse boxes FB0–FB(n-1), a select signal CS1 of a logic low state is generated through the decoding block 320 and the NOR gate 340. Accordingly, the multiplexing section 180 responds to the select signal CS1 of a logic low state and selects data read out from a specified cell of the cell array section 140 through the sense amplifier section 160.

On the other hand, if an input address designates a defective cell (data "0" defect), either one of the two fuses in each fuse box is cut according to a value of the input address, so that the fuse boxes output high-level signals FO0–FO(n−1), respectively. For example, if an input address bit for the defective cell is a "0," then the fuse 306 is cut and an inverted address signal AXiB of "1" is transferred to the output terminal Fouti via the transmission gate 304 and the fuse 308. Likewise, if an input address bit for the defective cell is a "1," then the fuse 308 is cut and the address signal AXi of "1" is transferred to the output terminal Fouti via the transmission gate 302 and the fuse 306 without modification. Thus, the fuse boxes output high-level signals FO0–FO(n−1), so that the select signal CS1 goes high. This makes the multiplexing section 180 select the ground line 200. Namely, the data "0" defect is repaired without a separate redundant cell.

For example, if an input address is an 8-bit address, there are needed 8 fuse boxes FB0–FB7 as illustrated in FIG. 3B. At this time, it is assumed that an input address "10100011" designates a defective cell. In this case, there are cut a fuse 308 of the fuse box FB0, a fuse 306 of the fuse box FB1, a fuse 308 of the fuse box FB2, a fuse 306 of the fuse box FB3, a fuse 306 of the fuse box FB4, a fuse 306 of the fuse box FB5, a fuse 308 of the fuse box FB6, and a fuse 308 of the fuse box FB7. As described above, thus, the fuse boxes FB0–FB7 all output high-level signals, F0-F7 respectively.

Meanwhile, turning back to FIG. 2 if a data "1" defect exists after manufacturing a ROM device, it can be repaired by connecting an input of a multiplexing section 180 to an operating voltage line that is not ground (e.g., a supply voltage), instead of a ground line. The operating voltage line is a wire supplied with an operating voltage when a ROM device operates. The data "1" defect can be also repaired without using a separate redundant cell array.

Figure 4:
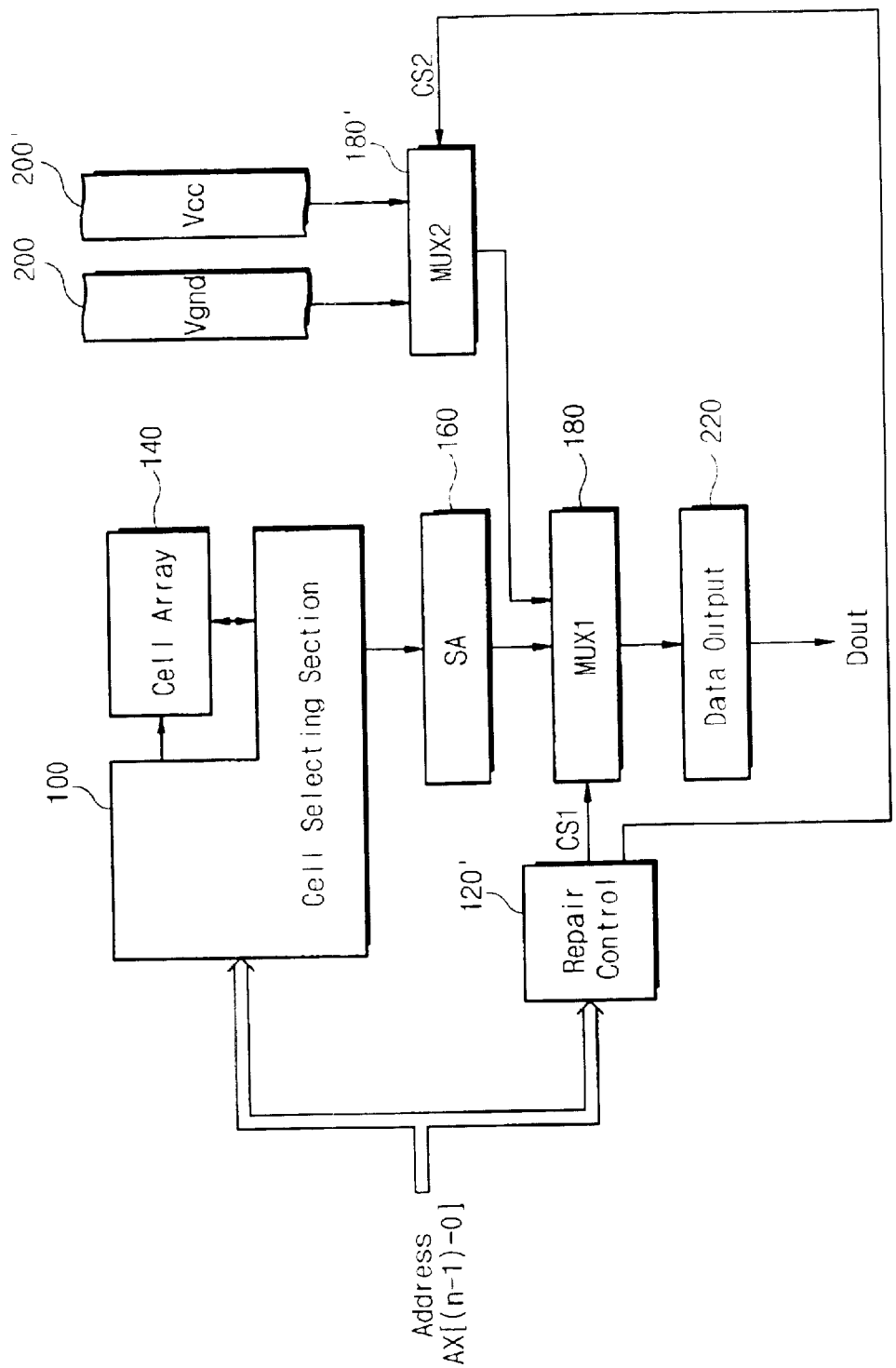
FIG. 4 is a schematic diagram of a ROM device according to a second preferred embodiment of the present invention.

FIG. 4 is a block diagram of a ROM device that can repair data "0" and "1" defects. In a ROM device, since data in a cell is fixed, it is previously open to a manufacturer to determine whether data in a memory cell of any address is "0" or "1". Namely, if an address for accessing a memory cell is received, whether a cell to be accessed is a defective cell and whether the defective cell is any type of defect can be previously determined. Accordingly, the data "0" and "1" defects all can be repaired by realizing in the ROM device a further multiplexing section that has two inputs, connected to ground and operating voltage lines, and that selects either one of the input lines. A detailed description is as follows.

In FIG. 4, constituent elements which are identical with those in FIG. 2 are marked by the same reference numerals. As illustrated in FIG. 4, the ROM device of the present invention includes a cell selecting section 100, a repair control section 120', a cell array section 140, a sense amplifier section 160, the first multiplexing section 180 (abbreviated "MUX1" in the figure), the second multiplexing section 180' (abbreviated "MUX2" in the figure), and a data output section 220. The second multiplexing section 180' selects either the ground line 200 or the operating voltage line 200' and outputs a voltage of the selected line to the first multiplexing section 180. The first multiplexing section 180 selects one of the output signals of the sense amplifier section 160 and the second multiplexing section 180', and transfers a selected signal to the data output section 220. The first and second multiplexing section 180 and 180' operate responsive to corresponding select signals CS1 and CS2 from the repair control section 120'.

For example, if an input address designates a cell of a data "1" defect, the repair control section 120' generates the select signal CS1 of a logic high state. Also, the repair control section 120' generates the select signal CS2 of a logic low or high state according to the type of defective cell. This will be described below. When the select signal CS2 is at a logic low state, the second multiplexing section 180' selects the ground line 200 and outputs the ground voltage. When the select signal CS2 is at a logic high state the second multiplexing section 180' selects the operating voltage line 200' and outputs the operating voltage that is not ground.

Figure 5:
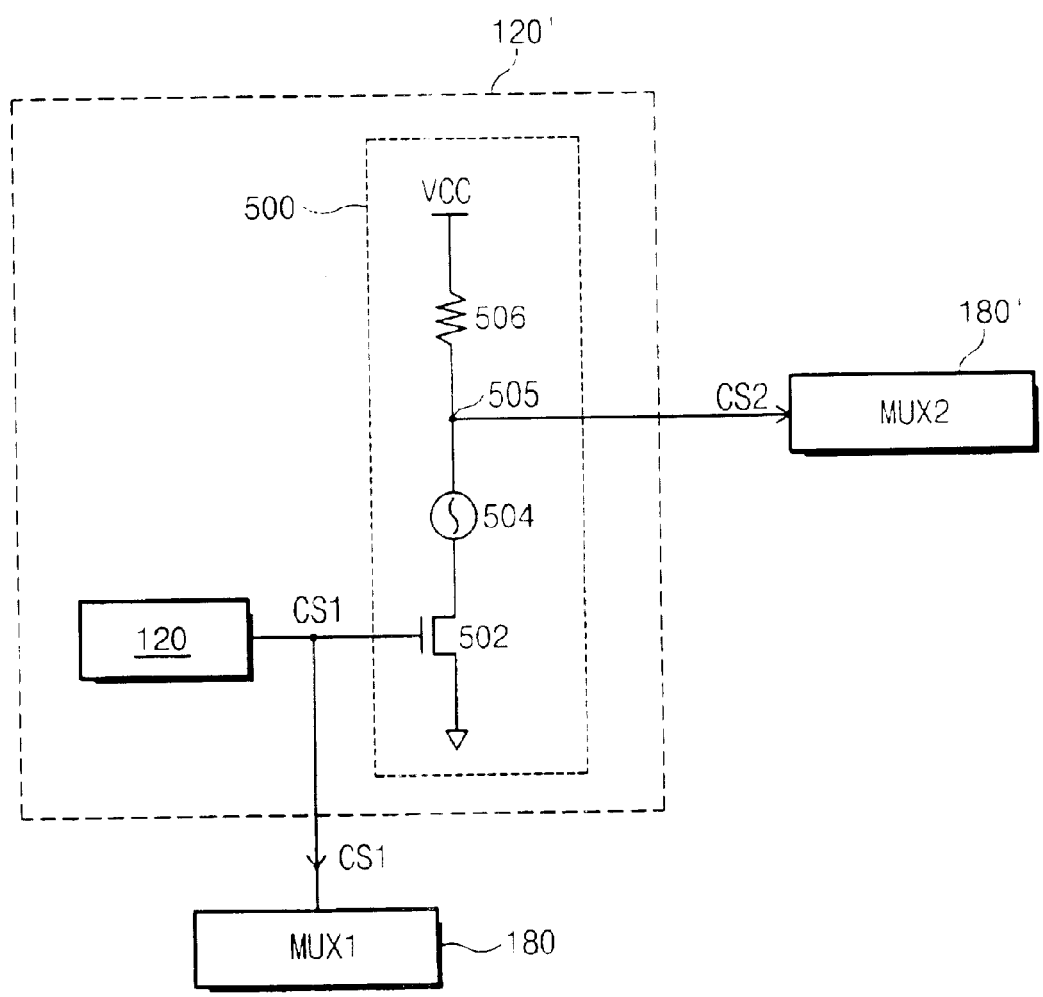
FIG. 5 is a preferred embodiment of a repair control section illustrated in FIG. 4.

FIG. 5 shows a repair control section 120' illustrated in FIG. 4. In FIG. 5, the portions of the repair control section that are the same as those described in FIGS. 3A and 3B will be omitted for brevity's sake.

The repair control section 120' further comprises a fuse box 500 together with a repair control section 120, which is the same as illustrated in FIG. 3A. Referring to FIG. 5, the fuse box 500 is formed of a resistor 506, a fuse 504 and an NMOS transistor 502 connected in series between a power supply voltage VCC and ground voltage. The NMOS transistor 502 whose gate is connected to receive a select signal CS1 has its source grounded and its drain connected to the fuse 504. An interconnection of the fuse 504 and the resistor 506 forms an output terminal 505 that outputs a select signal CS2.

If a current path is formed between the power supply voltage and the ground voltage, a divided voltage appears at the output terminal 505. The divided voltage is determined by a ratio of a sum resistance value of the fuse 504 and the NMOS transistor 502 to a resistance value of the resistor 506. A resistance value of the resistor 506 is far larger than a sum resistance value of the fuse 504 and the NMOS transistor 502. By this condition, when the fuse 504 is not cut, a current path is formed between the power supply voltage VCC and the ground voltage. At this time, a voltage appearing at the output terminal 505 is far lower than the power supply voltage VCC. Accordingly, the select signal CS2 goes low. On the other hand, if the fuse 504 is cut, the select signal CS2 goes high.

For example, the fuse 504 is not cut when a data "0" defect arises, and is cut when a data "1" defect arises. Alternatively, the opposite configuration can be employed.

Operation of the repair control circuit 120' will be fully described below.

If an input address corresponds to a defective cell, as described above, a repair control section 120 outputs a select signal CS1 having a logic high state. An NMOS transistor 502 is turned on by the select signal CS1. Meanwhile, since data in a cell corresponding to the input address is available, there is determined from the input address whether either a data "0" defect or a data "1" defect arises.

Accordingly, if an input address is related to a data "0" defect, a fuse 504 in a fuse box 500 is not cut. A current path is formed between a power supply voltage VCC and a ground voltage. This means that a select signal CS2 of a logic low state is outputted from an output terminal 505. The second multiplexing section 180' selects a ground line 200 in response to the select signal CS2. Meanwhile, since the select signal CS1 is at a logic high state, the first multiplexing section 180 selects an output (i.e., ground voltage) of the second multiplexing section 180', instead of the cell having the data "0" defect, and outputs a selected signal to a data output section 220. As a result, the data "0" defect is repaired without a separate redundant cell array.

Meanwhile, if an input address is related to a data "1" defect, the fuse 504 is cut, so that the select signal CS2 goes high. The second multiplexing section 180' selects an operating voltage line 200' in response to the select signal CS2. An output of the second multiplexing section 180' (i.e., an operating voltage that is not ground, such as a supply voltage) is transferred to the data output section 220 via the first multiplexing section 180. Thus, the data "1" defect is repaired without a separate redundant cell array.

As set forth above, since no redundant cell array for repairing defective cells is required, the ROM is conducive to a high density. Also, since defective cells are replaced with a ground or operating voltage line, data coding and test operations for cells to be replaced are not needed. This allows the cost to decrease.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A ROM device having a repair function comprising:
a ROM cell array which has a plurality of memory cells;
a cell selecting section which selects at least one of the plurality of memory cells in response to an input address;
a sense amplifier section which senses data stored in the selected memory cell;
a repair control section which generates a first select signal in response to the input address; and
a first multiplexing section which selects and, in response to the first select signal, outputs one selected from the group consisting of an output of the sense amplifier section and a fixed voltage.

2. The ROM device according to claim 1, wherein the repair control section generates the first select signal having either one of two complementary states according to whether the input address corresponds to a defective cell, and wherein the first multiplexing section selects the fixed voltage when the first select signal is at a first logic state, and selects the output of the sense amplifier section when the first select signal is at a second logic state.

3. The ROM device according to claim 1, wherein the fixed voltage is one selected from ground voltage and an operating voltage of the device that is not ground, and wherein the fixed voltage is ground when a defective cell has a data "0" defect, and the fixed voltage is the operating voltage when the defective cell has a data "1" defect.

4. The ROM device according to claim 1, wherein the cell selecting section includes:
a row decoder section which decodes a row address of the input address to select a row;
a row driving section which drives the selected row; and
a column decoder section which decodes a column address of the input address to select a column.

5. The ROM device according to claim 1, wherein the fixed voltage is one selected from ground and an operating voltage of the device that is not ground,
wherein the repair control section further includes a second multiplexing section for selecting either the ground or the operating voltage, and for transferring a selected signal to the first multiplexing section, and
wherein the repair control section generates a second select signal for controlling an output of the second multiplexing section.

6. The ROM device according to claim 5, wherein the repair control section generates the first select signal having either one of complementary states according to whether the input address corresponds to a defective cell,
wherein the first multiplexing section selects the fixed voltage when the first select signal is at a first logic state, and selects the output of the sense amplifier section when the first select signal is at a second logic state, and
wherein when the first select signal is at the first logic state, the second multiplexing section selects the operating voltage in response to the second select signal having the first logic state, and selects the ground voltage in response to the second select signal having the second logic state.

7. The ROM device according to claim 1, wherein the repair control section includes:
a plurality of fuse boxes corresponding to a number of bits in the input address, wherein each fuse box has two fuses;
a decoding block which has a plurality of NAND gates and receives outputs of the plurality of fuse boxes; and
a NOR gate which is connected to outputs of the NAND gates,
wherein when the input address designates a defective cell, either one of the two fuses in the respective fuse boxes corresponding to an input address bit is cut so as to output a signal of a first state, and
wherein when the input address designates a normal cell, the two fuses in the respective fuse boxes are not cut so as to output a signal of a second state.

8. The ROM device according to claim 5, wherein the repair control section includes:
plurality of fuse boxes corresponding to a number of bits in the input address, wherein each fuse box includes first and second fuses;
a decoding block which has a plurality of NAND gates and receives outputs of the plurality of fuse boxes;
a NOR gate which is connected to outputs of the NAND gates to output the first select signal;
an NMOS transistor which has a gate connected to receive an output of the NOR gate and a source grounded;
a third fuse which has a first end connected to a drain of the NMOS transistor; and
a resistor which has a first end connected to a second end of the third fuse, and a second end connected to receive the operating voltage, the second select signal being outputted from an interconnection of the third fuse and resistor,
wherein when the input address designates a defective cell, either one of the first and second fuses in respective fuse boxes corresponding to an input address bit is cut so as to output a signal having a first state,
wherein when the input address designates a normal cell, the first and second fuses in the respective fuse boxes are not cut so as to output a signal of a second state,
wherein when a defective cell has a data "1" defect, the third fuse is cut so that the second select signal has a first logic state and the second multiplexing section selects the operating voltage, and when a defective cell has a data "0" defect, the third fuse is not cut so that the second select signal has a second logic state and the second multiplexing section selects the ground voltage.

9. A ROM device having a repair function comprising:
a cell array section which has a plurality of memory cells each storing a fixed data value;
a cell selecting section which selects at least one of the memory cells in response to an input address;
a sense amplifier section which senses data stored in the selected memory cell;
a repair control section which generates a first select signal and a second select signal in response to the input address; and
first and second multiplexing sections which operate responsive to the first and second select signals respectively,
wherein in response to the first select signal, the first multiplexing section selects and outputs one selected from the group consisting of an output of the sense amplifier section, and an output of the second multiplexing section, and
wherein in response to the second select signal the second multiplexing section selects one selected from the group consisting of a ground voltage and an operating voltage that is not ground.

10. The ROM device according to claim 9, wherein the repair control section generates the first select signal having a first logic state when the input address corresponds to a defective cell and a second logic state when the input address corresponds to a normal cell, and wherein the repair control section generates the second select signal having either one of two complementary states according to a defect type of the defective cell when the first select signal has the first logic state.

11. The ROM device according to claim 10, wherein when the input address corresponds to a defective cell, the first select signal has the first logic state and the first multiplexing section selects the output of the second multiplexing section,
wherein when the defective cell has a data "1" defect, the second select signal has the first logic state and the second multiplexing section selects the operating voltage; and
wherein when the defective cell has a data "0" defect, the second select signal has the second logic state and the second multiplexing section selects the ground voltage.

12. The ROM device according to claim 9, wherein the ground voltage is a ground voltage of the device, and the operating voltage is formed in the device.

13. The ROM device according to claim 9, wherein the repair control section includes:
a plurality of fuse boxes which correspond to a number of bits in the input address;
a decoding block which has a plurality of NAND gates and receives outputs of the plurality of fuse boxes;
a NOR gate which is connected to outputs of the NAND gates to output the first select signal;
a first NMOS transistor which has a gate connected to receive an output of the NOR gate and a source grounded;
a select fuse which has a first end connected to a drain of the NMOS transistor; and
a resistor which has one end connected to a second other end of the select fuse, and a second end connected to receive the supply voltage, the second select signal being outputted from an interconnection of the select fuse and resistor, and
wherein each of the fuse boxes comprises:
a first CMOS transmission gate which receives an address bit;
a first address fuse which is connected to the first CMOS transmission gate;
a second CMOS transmission gate which an inverted version of the address bit;
a second address fuse which is connected to the second CMOS transmission gate; and
a second NMOS transistor which is connected between an interconnection node of the first and second address fuses and a ground voltage.

14. The ROM device according to claim 13, wherein when the input address corresponds to a defective cell, the first select signal has a first logic state and the first multiplexing section selects the output of the second multiplexing section,
when the defective cell has a data "1" defect, the second select signal has the first logic state and the second multiplexing section selects the operating voltage; and
wherein when the defective cell has a data "0" defect, the second select signal has a second logic state and the second multiplexing section selects the ground voltage.

15. A repair method of a ROM device which includes a plurality of memory cells each storing a fixed data value, comprising:
generating a select signal according to whether a memory cell designated by an input address is a defective cell or a normal cell; and
selecting and outputting either a fixed voltage or a data value of the designated memory cell in response to the select signal.

16. The repair method according to claim 15, wherein the fixed voltage is a ground voltage when the defective cell is a data "0" defect, and wherein the fixed voltage is an operating voltage that is not ground when the defective cell is a data "1" defect.

17. The repair method according to claim 15, wherein when the designated memory cell is the data value, the select signal is inactivated and the data value is selected, and wherein when the designated memory cell is the defective cell, the select signal is activated and the fixed voltage is selected.

18. The repair method according to claim 17, further comprising generating a second select signal for selecting either one of a ground voltage or an operating voltage that is not ground according to a defect type of the defective cell.

* * * * *